(12) United States Patent
Banting

(10) Patent No.: US 7,930,141 B2
(45) Date of Patent: Apr. 19, 2011

(54) COMMUNICATING FAULTED CIRCUIT INDICATOR APPARATUS AND METHOD OF USE THEREOF

(75) Inventor: John Fredrick Banting, Waukesha, WI (US)

(73) Assignee: Cooper Technologies Company, Houston, TX (US)

( * ) Notice: Subject to any disclaimer, the term of this patent is extended or adjusted under 35 U.S.C. 154(b) by 555 days.

(21) Appl. No.: 11/982,588

(22) Filed: Nov. 2, 2007

(65) Prior Publication Data

US 2009/0119068 A1    May 7, 2009

(51) Int. Cl.
*G01R 31/08* (2006.01)
*G06F 17/00* (2006.01)

(52) U.S. Cl. .............. 702/183; 702/58; 702/59; 702/62; 700/292; 324/512

(58) Field of Classification Search .................. 702/183, 702/58, 59, 62, 185
See application file for complete search history.

(56) References Cited

U.S. PATENT DOCUMENTS

| | | | |
|---|---|---|---|
| 3,025,512 A | 3/1962 | Bloechl | |
| 3,364,481 A | 1/1968 | Fuzzell | |
| 3,460,038 A | 8/1969 | Ziegler | |
| 3,700,967 A | 10/1972 | Ross | |
| 3,720,872 A | 3/1973 | Russell et al. | |
| 3,725,846 A | 4/1973 | Strain | |
| 3,735,248 A | 5/1973 | Reese | |
| 3,816,816 A | 6/1974 | Schweitzer, Jr. | |
| 3,995,243 A | 11/1976 | Malmborg | |
| 4,000,462 A | 12/1976 | Boyd et al. | |
| 4,037,155 A | 7/1977 | Ahmed | |
| 4,045,726 A | 8/1977 | Schweitzer, Jr. | |
| 4,157,520 A | 6/1979 | Moates et al. | |
| 4,165,528 A | 8/1979 | Schweitzer, Jr. | |
| 4,288,743 A | 9/1981 | Schweitzer | |
| 4,335,437 A | 6/1982 | Wilson et al. | |
| 4,384,289 A | 5/1983 | Stillwell et al. | |
| 4,456,873 A | 6/1984 | Schweitzer, Jr. | |
| 4,466,042 A | 8/1984 | Zylstra et al. | |
| 4,495,489 A | 1/1985 | Schweitzer, Jr. | |

(Continued)

FOREIGN PATENT DOCUMENTS

WO   WO 2007/143378    12/2007

OTHER PUBLICATIONS

U.S. Appl. No. 11/982,587, Banting et al.

(Continued)

*Primary Examiner* — Hal D Wachsman
(74) *Attorney, Agent, or Firm* — King & Spalding LLP

(57) ABSTRACT

A communicating faulted circuit indicator ("FCI") apparatus, as well as methods for using the apparatus. A sensor is configured to collect data relating to a state of an electrical conductor. A controller is logically coupled to the sensor and configured to receive the data collected by the sensor and to determine whether to communicate the collected data to a location remote from the FCI. A communications facility is logically coupled to the controller and configured to communicate the data to the remote location in response to the controller's determination to communicate the data to the remote location. The communications facility can include a cellular communications device. The remote location can comprise a cellular communications device. The remote location also can be a computer system configured to receive communications from the FCI.

43 Claims, 5 Drawing Sheets

U.S. PATENT DOCUMENTS

| | | | |
|---|---|---|---|
| 4,510,476 A | 4/1985 | Clatterbuck et al. | |
| 4,558,310 A | 12/1985 | McAllise | |
| 4,593,276 A | 6/1986 | Aida et al. | |
| 4,630,218 A | 12/1986 | Hurley | |
| 4,661,813 A | 4/1987 | Mazzamauro et al. | |
| 4,686,518 A | 8/1987 | Schweitzer, Jr. | |
| 4,694,599 A | 9/1987 | Hart et al. | |
| 4,739,149 A | 4/1988 | Nishiwaki et al. | |
| 4,746,241 A | 5/1988 | Burbank, III | |
| 4,794,332 A | 12/1988 | Schweitzer, Jr. | |
| 4,795,982 A | 1/1989 | Schweitzer, Jr. | |
| 4,799,005 A | 1/1989 | Fernandes | |
| 4,801,937 A | 1/1989 | Fernandes | |
| 4,847,780 A | 7/1989 | Gilker et al. | |
| 4,881,028 A | 11/1989 | Bright | |
| 4,886,980 A | 12/1989 | Fernandes et al. | |
| 4,984,124 A | 1/1991 | Yeh | |
| 5,029,039 A | 7/1991 | Yeh | |
| 5,095,274 A | 3/1992 | Brokaw | |
| 5,155,440 A | 10/1992 | Huang | |
| 5,159,319 A | 10/1992 | Dunk et al. | |
| 5,220,311 A | 6/1993 | Schweitzer, Jr. | |
| 5,241,444 A | 8/1993 | Yeh | |
| 5,258,903 A | 11/1993 | Rodriguez-Cavazos | |
| 5,440,234 A | 8/1995 | Kondo | |
| 5,475,371 A | 12/1995 | Dunk et al. | |
| 5,485,545 A | 1/1996 | Kojima et al. | |
| 5,497,096 A | 3/1996 | Banting | |
| 5,537,327 A | 7/1996 | Snow et al. | |
| 5,548,279 A | 8/1996 | Gaines | |
| 5,559,500 A | 9/1996 | Kase | |
| 5,574,387 A | 11/1996 | Petsche et al. | |
| 5,576,632 A | 11/1996 | Petsche et al. | |
| 5,629,870 A | 5/1997 | Farag et al. | |
| 5,650,728 A | 7/1997 | Rhein et al. | |
| 5,661,626 A | 8/1997 | Takeuchi | |
| 5,675,497 A | 10/1997 | Petsche et al. | |
| 5,714,886 A | 2/1998 | Harris | |
| 5,726,847 A | 3/1998 | Dalstein | |
| 5,734,575 A | 3/1998 | Snow et al. | |
| 5,754,383 A | 5/1998 | Huppertz et al. | |
| 5,784,233 A | 7/1998 | Bastard et al. | |
| 5,796,631 A | 8/1998 | Iancu et al. | |
| 5,805,400 A | 9/1998 | Kim | |
| 5,945,820 A | 8/1999 | Namgoong et al. | |
| 5,959,537 A | 9/1999 | Banting et al. | |
| 6,344,748 B1 | 2/2002 | Gannon | |
| 6,535,797 B1 | 3/2003 | Bowles et al. | |
| 6,587,027 B1 | 7/2003 | Nadd | |
| 6,687,574 B2 * | 2/2004 | Pietrowicz et al. | 700/293 |
| 6,798,211 B1 | 9/2004 | Rockwell et al. | |
| 6,815,932 B2 | 11/2004 | Wall | |
| 7,010,437 B2 * | 3/2006 | Lubkeman et al. | 702/58 |
| 7,256,701 B2 | 8/2007 | Kono et al. | |
| 7,282,944 B2 | 10/2007 | Gunn et al. | |
| 7,398,097 B2 | 7/2008 | Parkulo | |
| 7,453,267 B2 | 11/2008 | Westbrock, Jr. et al. | |
| 7,518,529 B2 | 4/2009 | O'Sullivan et al. | |
| 7,576,548 B1 | 8/2009 | Lo et al. | |
| 7,714,735 B2 | 5/2010 | Rockwell | |
| 7,733,224 B2 | 6/2010 | Tran | |
| 2005/0017751 A1 | 1/2005 | Gunn et al. | |
| 2005/0146220 A1 | 7/2005 | Hamel et al. | |
| 2005/0151659 A1 * | 7/2005 | Donovan et al. | 340/664 |
| 2006/0063522 A1 | 3/2006 | McFarland | |
| 2006/0084419 A1 * | 4/2006 | Rocamora et al. | 455/419 |
| 2007/0085693 A1 * | 4/2007 | Feight | 340/635 |
| 2007/0086135 A1 * | 4/2007 | Swartzendruber et al. | 361/90 |
| 2007/0268644 A1 * | 11/2007 | Schweitzer et al. | 361/115 |
| 2007/0270114 A1 * | 11/2007 | Kesler et al. | 455/187.1 |
| 2008/0012702 A1 * | 1/2008 | Feight et al. | 340/539.22 |
| 2008/0077336 A1 | 3/2008 | Fernandes | |
| 2008/0100436 A1 | 5/2008 | Banting et al. | |
| 2008/0284585 A1 * | 11/2008 | Schweitzer et al. | 340/539.3 |
| 2009/0115426 A1 | 5/2009 | Muench, Jr. et al. | |

OTHER PUBLICATIONS

U.S. Appl. No. 12/048,963, Banting et al.

"EE's tools & toys", IEEE Spectrum, Dec. 1997, pp. 62-63.

"Fault Indicators, S.T.A.R.TM. Type ER Faulted Circuit Indicator Installation Instructions s320-60-1", Dec. 1997, Cooper Power Systems, pp. 1-2.

"Fault Indicators, S.T.A.R..TM. Faulted Circuit Indictors Electrostatic Reset Type 320-60" May 1997, Cooper Power Systems, pp. 1-4.

"Fault Indicators, S.T.A.R..TM. Type TPR Faulted Circuit Indicator Installation Instructions s320-40-1". Dec. 1997, Cooper Power Systems, pp. 1-3.

"Fault Indicators, S.T.A.R..TM. Faulted Circuit Indicators Test Point Reset Type 320-40", May 1997, Cooper Power Systems, pp. 1-4.

"S.T.A.R..TM. Faulted Circuit Indicators, Test Point Reset Type", Cooper Power Systems, Jan. 1998, Bulletin No. 97034.

"Fault Indicators, S.T.A.R..TM. Faulted Circuit Indicators Low Voltage Reset Type 320-50", May 1997, Cooper Power Systems, pp. 1-4.

"Fault Indicators, S.T.A.R..TM, Type LV Faulted Circuit Indicator Installation instructions s320-50-1", Cooper Power Systems, pp. 1-4, May 1997.

"S.T.A.R..TM. Faulted Circuit indicators, Low Voltage Reset Type", Cooper Power Systems, Jan. 1998, Bulletin No. 97035.

* cited by examiner

COMMUNICATING FAULTED CIRCUIT INDICATOR APPARATUS AND METHOD OF USE THEREOF

RELATED APPLICATIONS

This application is related to U.S. patent application Ser. No. 11/982,587, entitled "Faulted Circuit Indicator Apparatus with Transmission Line State Display and Method of Use Thereof," filed on Nov. 2, 2007.

TECHNICAL FIELD

The invention relates generally to faulted circuit indicators and more particularly to the communication of the state of a transmission line by the faulted circuit indicator, including real-time or near real-time measurements of electrical current and voltage, as well as other state information.

BACKGROUND

Faulted circuit indicators (FCIs) are used in the field of electric power distribution systems. Generally, FCIs are electrically connected to transmission lines in a power distribution system at various locations throughout the system, often in close proximity to system loads. When a fault occurs in a transmission line, FCIs between the fault and the source will detect that a fault has occurred. Typically, FCIs that have detected a fault then display an indication that the fault has been detected. A technician can then identify a fault by locating the transmission line between an FCI that indicates it has detected a fault and an FCI that displays no such indication.

Because of their binary nature, conventional FCIs provide little assistance in locating a transient or intermittent fault. Generally, conventional FCIs are reset either by a manual trigger, wherein a technician manually manipulates the FCI to remove the fault indication, or by a current trigger, wherein if the FCI determines that conditions on the transmission line have returned to normal, the FCI automatically resets. In conventional FCIs, an automatic reset is a desirable feature because it ensures that the FCI only indicates existing faults, which reduces the likelihood that a false fault indication will increase the amount of time necessary for a technician to diagnose and repair an actual fault. However, an automatic reset results in an intermittent or transient fault triggering an FCI's indicator only for a short time, followed by an immediate reset of the indicator, making the location of a faulted FCI during the presence of a faulted condition nearly impossible.

Additionally, conventional FCIs cannot monitor other conditions on a transmission line that can pose risks to the life or performance of the transmission line and other related equipment. For example, power surges at certain levels can not be sufficient to result in a fault condition indicated by conventional FCIs. However, such power surges can shorten the life of a transmission line that experiences those surges and any transformers or other equipment attached to that line. Additionally, conditions such as excess heat or vibration on a line can indicate a problem on a transmission line that, with the use of conventional FCIs, cannot be detected until a fault occurs, potentially resulting in a loss of service for customers that might have been avoided had the condition been diagnosed earlier.

Finally, when a fault occurs, the only way to determine which portion of a transmission line contains the fault in conventional systems is to send technicians to the general vicinity of a power outage to search for FCIs that indicate a fault. Because transmission lines often are located underground, this design can require the technicians to travel from FCI to FCI on foot until they locate the first faulted FCI. Thus, even with the help of FCIs, the process of locating a fault can be time consuming, resulting in increased costs to the electrical utility company servicing the fault, as well as extended periods of outages for their customers.

Conventional FCIs are not capable of determining and transmitting the state of a transmission line, nor are conventional FCIs capable of transmitting fault information and state information relating to a transmission line to a remote location.

Accordingly, a need exists in the art for an FCI that is capable of monitoring multiple line conditions, including simple current flow, to assist in the determination of unfavorable conditions, storing historical fault and line state information to assist in the diagnosis of transient and intermittent faults, and communicating fault and line state information to a remote location to reduce the time needed to recover from a fault event.

SUMMARY

The invention can satisfy the above-described needs by providing a faulted circuit indicator that has a communications facility for communicating data to a remote location. The FCI includes a sensor for collecting data relating to the state of an electrical conductor. The sensor is coupled to a controller for receiving the sensor data and determining whether the data should be communicated to a remote location. The controller is further coupled to a communications facility that can communicate data relating to the state of the electrical conductor.

The communications facility can be a cellular communications device. The controller can determine that the data should be communicated if the data indicates that a fault has occurred on the electrical conductor. Alternatively, the controller can determine that the data should be communicated if the data indicates that an adverse condition exists on the electrical conductor. The data can be the current flowing through the conductor. Alternatively, the data can be the voltage present on the conductor, the temperature of the conductor, the vibration present on the electrical conductor, or any other suitable parameter.

The FCI can include a memory for storing data relating to the state of the electrical conductor, a record of the fact that a fault has occurred, or both. The remote location can be a computer configured to receive communications from the FCI. Alternatively, the remote location can be a cellular communications device.

The FCI also can include a second communications device. The second communications device can be used to allow a second faulted circuit indicator to communicate with the first FCI.

Additional aspects, objects, features, and advantages of the invention will become apparent to those having ordinary skill in the art upon consideration of the following detailed description of illustrated embodiments.

DETAILED DESCRIPTION OF EXEMPLARY EMBODIMENTS

The invention provides a faulted circuit indicator (FCI) system capable of determining the state of a transmission line with respect to a variety of characteristics, storing the state information, and communicating the state information by transmission of the information to a remote location.

The FCI system is attached to a transmission line, which allows electric utility companies to improve the ability to diagnose and repair problems within an electrical distribution system. The constant monitoring of state information provides notice of conditions, such as excessive heat or vibration that cannot register as a fault on conventional FCIs, but nonetheless present situations that require attention by the utility company, allowing for repair before a fault interrupts power for the utility company's customers. Finally, the communication of fault and state information to a remote location allows a utility company to pinpoint a fault before sending technicians out to repair the line, thus reducing the amount of time required to repair a fault.

As used herein, the term "transmission line" or "line" is intended to encompass any type of conductor that is used to transmit electricity from one location to another, but particularly refers to utility cables, whether above ground, underground, or otherwise, as are commonly used in electricity distribution systems. The term "distribution system" refers to an electricity distribution system wherein electricity generated at one or more electricity generation sites, or power plants, is transported and distributed to electricity consumers. The terms "technician" or "line technician" are interchangeably used to describe individuals whose responsibility includes locating, diagnosing, and repairing faults in transmission lines.

Referring now to the attached figures, in which like numerals represent like elements, certain exemplary embodiments of the invention will hereafter be described.

Figure 1:
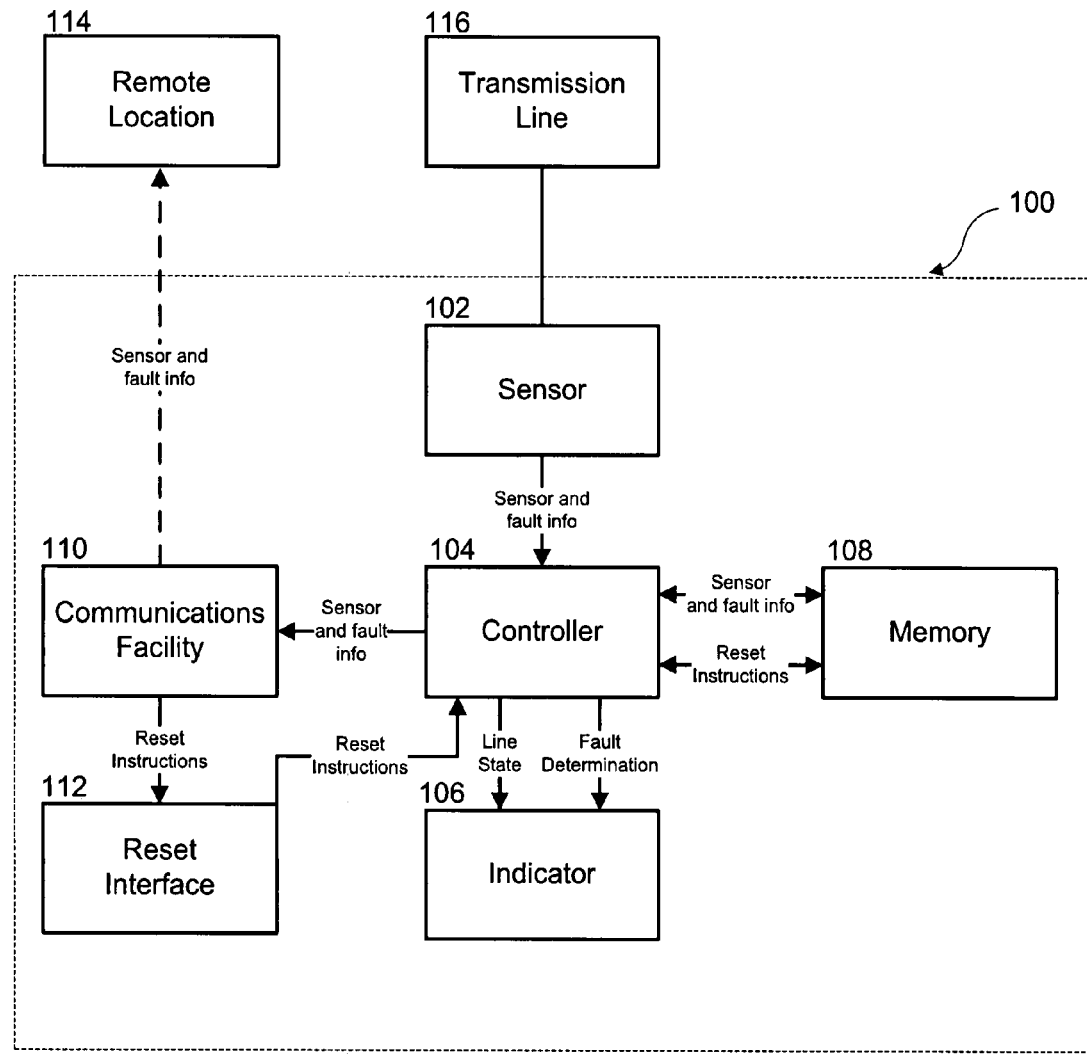
FIG. 1 is a block diagram depicting a faulted circuit indicator system with cellular communications capability according to an exemplary embodiment of the invention.

FIG. 1 is a block diagram depicting a faulted circuit indicator system 100 with cellular communications capability according to an exemplary embodiment of the invention. The FCI system 100 is electrically connected to a transmission line 116. Generally, the connection between the FCI system 100 and the transmission line 116 is provided by a clamping mechanism that ensures a strong connection between the FCI system 100 and the transmission line 116. The FCI system 100 can be powered in a variety of ways. In an exemplary embodiment the FCI system 100 can be powered by the magnetic field generated by the transmission line 116 to which the FCI system 100 is connected, along with a battery that can power the FCI system 100 should current in the attached transmission line 116 be interrupted. Alternative power supplies include, but are not limited to, solar power, current passing through the transmission line 116, a rechargeable battery that harvests energy from the current in the transmission line by using a current transformer, or by utilizing the reference voltage from an energized conductor to an adjacent ground.

The FCI system 100 comprises a sensor 102 that measures conditions on the transmission line 116. In an exemplary embodiment, the sensor 102 can measure in real time or near-real time the current and voltage on the transmission line 116. In an alternative embodiment, other types of sensors 102 can be used that are capable of measuring any suitable parameter for conditions that can be present on the transmission line 116 or the FCI system 100 itself, including but not limited to, line temperature, line tilt, ambient temperature, wind speed, liquid levels of electrical components, dissolved gas content or pressure from a monitored transformer, battery status, frequency, zero crossings, vibration, and/or power factor. The sensor 102 can be configured to measure one or more conditions. In some embodiments, two or more sensors 102 can be combined to measure multiple conditions. The sensor 102 communicates the measurements to a controller 104 as sensor data.

The controller 104 analyzes the sensor data and takes appropriate actions. In an exemplary embodiment, the controller 104 can be a microcontroller programmed to analyze the sensor data and to respond appropriately. In an alternative embodiment, the controller 104 can be any suitable control mechanism capable of receiving sensor data and controlling peripheral systems, such as a memory 108, a communications facility 110, and an indicator 106. For example, the controller 104 can comprise any combination of analog and/or digital electronics capable of establishing that a fault event has occurred.

In one embodiment, the controller 104 can be programmed to recognize certain changes in the sensor data as fault events. For example, the controller 104 can treat a drop in current in excess of a programmed threshold as indicative of the existence of a fault. However, the controller 104 can be programmed to identify any condition that occurs on the transmission line 116 as indicative of a fault. For example, the controller 104 can be programmed to identify a surge in current or voltage in excess of a predetermined threshold, a temperature reading in excess of a predetermined threshold, and/or vibration in excess of a predetermined threshold as a fault. The thresholds can be defined by the utility company employing the FCI system 100 in an electrical distribution system and can vary based on conditions in a particular area. If the controller 104 determines that a fault has occurred, it can communicate that fact to an indicator 106, a memory 108, and/or a communications facility 110 of the FCI system 100. In an alternative embodiment, the sensor 102 can comprise circuitry for determining whether a fault condition has occurred and for notifying the controller 104 of the fault event.

In embodiments where the controller 104 receives sensor data from the sensor 102, the controller 104 can be further programmed to identify certain other data that can be valuable to a utility company in diagnosing problems or inefficiencies in a distribution system. The controller 104 can be configured to record data in the memory 108 for later analysis by the utility company, a line technician, or another interested party. By way of example, an increase in temperature on a transmission line 116 may not result in a fault event, but may indicate that the transmission line 116, or some of its nearby equipment such as transformers, capacitors, capacitor banks, circuit breakers, and fuses, has developed a flaw that is creating additional resistance on the transmission line 116 and reducing efficiency. Similarly, the controller 104 can be programmed to monitor the zero crossings that occur on a transmission line 116 over a certain period of time. Information relating to zero crossings can be used to identify harmonics and momentaries that potentially indicate an unstable condition. Because the controller 104 (and/or sensor 102) has identified the condition before a fault has occurred, the utility company can determine whether remedial action is necessary to improve the performance of the transmission system or to prevent a fault that may result in a loss of power to the utility company's customers.

The controller 104 can be further programmed to identify data relating to the FCI system 100 itself and to record that data in the memory 108. For example, the controller 104 can identify and record battery status, geographic coordinates, ambient temperature, wind speed, liquid levels, dissolved gas content, pressure, and/or any other suitable data that may be of interest to a utility company.

The controller 104 can be further configured to communicate fault determinations to an indicator 106 and to communicate fault determinations and sensor data to a communications facility 110. If, as described above, the controller 104 (and/or sensor 102) determines that a fault event has occurred, then the controller 104 can communicate that information to an indicator 106. Further, without regard to whether a fault event has been established, the controller 104 can communicate sensor data to the memory 108 or to a communications facility 110.

For example, the controller 104 can be programmed to transmit sensor data from the sensor 102 after the passage of a set period, of time—for example, once per day—without regard to the data's contents. Such programming would allow a utility company to have frequent updates regarding the performance of the distribution system. The controller 104 also can be programmed to store sensor data after the passage of a set period of time—for example, once per hour—and then to transmit the stored information over a different period of time—for example, once per day. The periodicity of recording and transmitting of sensor data is at the discretion of the utility company to meet the particular needs of the environment in which the FCI system 100 is deployed. The controller 104 also can be programmed to transmit any sensor data that meets any of the fault or storage conditions described above.

The indicator 106 can be a display that is mounted on the FCI system 100 and situated such that it can be viewed from a distance. Thus, the indicator 106 can provide a visible indication that a fault has occurred. In one exemplary embodiment, the indicator can comprise a high visibility display device. However, the indicator alternatively can be a liquid crystal display (LCD) or other similar display device. Additionally, the indicator 106 can emit an audible sound that can alert a technician in the general vicinity of the FCI system 100 that the FCI system 100 has detected a fault condition. The audible indicator 106 can be in addition to, or an alternative to, a visible indicator 106.

The memory 108 can be any suitable storage device, such as flash memory or dynamic random access memory (DRAM). If the controller 104 determines that sensor data should be recorded, such as when the data represents an unusual condition or a fault, the controller 104 can record that data in the memory 108, and can optionally record information that relates to the data, such as the time the data was measured, the geographic coordinates of the FCI that recorded the data, the ambient conditions at the time the data was recorded, or any other data that the FCI has measured or recorded.

The memory 108 also can store information that relates to the FCI system 100. For example, in an exemplary embodiment, upon installation, the memory 108 can be programmed with the global coordinates of the FCI system 100. Alternatively, the memory 108 can store other identifying information, such as, but not limited to, the street address of the installation, a unique identifier for the FCI system 100, grid coordinates, or an identifier for a nearby utility pole or other landmark.

The communications facility 110 provides a system that is capable of transmitting data to a remote location 114. In an exemplary embodiment, the communications facility 110 communicates with the remote location 114 using cellular technologies, such as GSM (Global System for Mobile communications) or CDMA (Code Division Multiple Access). The communications facility 110 also can include components for any number of wireless or wired communications protocols, including, but not limited to, any of the 802.11 standards, Bluetooth (IEEE 802.15.1), ZigBee (IEEE 802.15.4), Internet Protocol, licensed or un-licensed radio, fiber, or power line carrier communications technologies. The communications facility 110 can provide the function of communicating sensor data to a remote location 114.

In an exemplary embodiment, the remote location 114 can be related to a utility company's central office and has the capability of simultaneously monitoring communication feeds from numerous FCI systems 100 and communicating information from those feeds to an entity or individual that is responsible for repair and maintenance to the distribution system. In this embodiment, the remote location 114 comprises a central server that is connected to a utility company's outage management system. Upon receiving communication of fault or sensor data, the server then processes the information and translates the data format as necessary into an appropriate format such as, but not limited to, Distributed Network Protocol (DNP), Inter-Control Center Communications Protocol (ICCP), Multispeak, or other communications protocols. The server then transmits the information to the outage management system, where it can be viewed on the utility company consoles. Either the server or the outage management system also can provide direct communications to individuals who can address the problem. For example, upon receiving information relating to a fault, the system can automatically direct an electronic mail message or telephone call to a line technician in the area, who can receive the message on a mobile communications device, such as a wireless phone, personal digital assistant, or other suitable communications device.

In an alternative embodiment, the remote location 114 can comprise a system capable of generating information that is accessible by the utility company, such as a World Wide Web page that graphically displays information to the viewer. In this embodiment, upon receiving a communication of fault or sensor data, the server generates a web page that, if accessed, displays some or all of that information to the viewer. Utility company representatives then can visit the web page to retrieve the data. The server in this embodiment also can provide communications to individuals via telephone or electronic mail message, as described with respect to the previous exemplary embodiment.

In another alternative embodiment, the remote location 114 can be a communications device, such as a cellular telephone, or a personal digital assistant (PDA). The remote location also can be any location accessible via the internet, such as an electronic mail address. In this embodiment, the communications facility 100 uses cellular communications to communicate directly with the remote location 114 via telephone, short message service (SMS) message, or electronic mail. In this embodiment, the FCI system 100 can provide direct notice to individuals who are in a position to address any concerns that raised by the communication.

The communications facility 110 also can facilitate communications between two or more FCI systems 100. This embodiment is especially advantageous when multiple FCI systems 100 are located within a short distance of one another. By way of example only, it may be desirable to install three FCI systems on a single three-phase transmission line, such that one FCI system monitors each individual phase. In such an implementation, it can be desirable to implement cellular communications in the communications facility 110 of one of the FCI systems 100. The FCIs then communicate with one another using a short range wireless protocol, such as Bluetooth, WiFi, or ZigBee, or a wired protocol, such as power line carrier networking. If one of the FCIs in which cellular communications is not installed detects a fault condition, or determines that sensor data should be transmitted to a remote location using cellular communications, that FCI can transmit to the cellular-enabled FCI system 100 using the short range wireless protocol or the wired protocol, and the cellular-enabled FCI system 100 can relay the transmission to the remote location 114. This multiple FCI embodiment is also applicable to FCIs located in close proximity to each other on different transmission lines or other equipment. "Close proximity" can be within the communications distance of the short range wireless protocol or the wired protocol.

In exemplary embodiments, the reset interface 112 can have two distinct reset instructions: an indicator reset and a memory reset. The indicator reset instruction removes the fault indication, while the memory reset instruction clears at least some of the sensor data from the memory 108. The memory reset instruction can comprise parameters that indicate the portions of the memory to be cleared. For example, the memory reset instruction can specify that only sensor data recorded before a certain date should be cleared, that all sensor data should be cleared, that sensor data and information relating to the FCI should be cleared, that all data other than information relating to the FCI should be cleared, and/or other suitable parameters that identify which memory should be erased. While both the indicator reset and the memory reset instructions can be triggered by the same event, it may be desired in some instances to reset one or the other in isolation.

For example, in an exemplary embodiment, the controller 104 can be programmed to respond to the resumption of proper current flow after a fault event by issuing an indicator reset instruction but not a memory reset instruction. In this mode of operation, a record of the fault event, as well as the conditions that accompanied the event, will remain in memory 108 even though the fault indicator 106 has been cleared. The information can then be downloaded from the memory 108 and analyzed, and the FCI system 100 will not indicate a fault situation when none presently exists. Thus, the invention can provide automatic reset when proper current flow resumes, while also storing data that can be used to diagnose and locate transient or intermittent faults.

Additionally, the reset interface 112 can receive reset instructions directly from a technician that is "on-site." In an exemplary embodiment, the technician provides reset instructions by activating one or more buttons (not shown) on the FCI system 100 or a keyboard (not shown) connected to the FCI system 100. In an alternative embodiment, reset instructions can be provided via switches or other common input techniques such as from a computer, PDA, or a cellular telephone.

In an exemplary embodiment, the sensor 102, controller 104, memory 108, communications facility 110, and reset interface 112 can be provided inside a weatherproof housing, while the indicator 106 is disposed on the outer surface of the housing such that the indicator 106 can be viewed from a distance. In alternative embodiments, each component can be disposed either inside or outside the housing. The housing can be clamped to the transmission line 116 with a clamping mechanism, and the sensor 102 can be logically coupled to a portion of the clamping mechanism.

Figure 2:
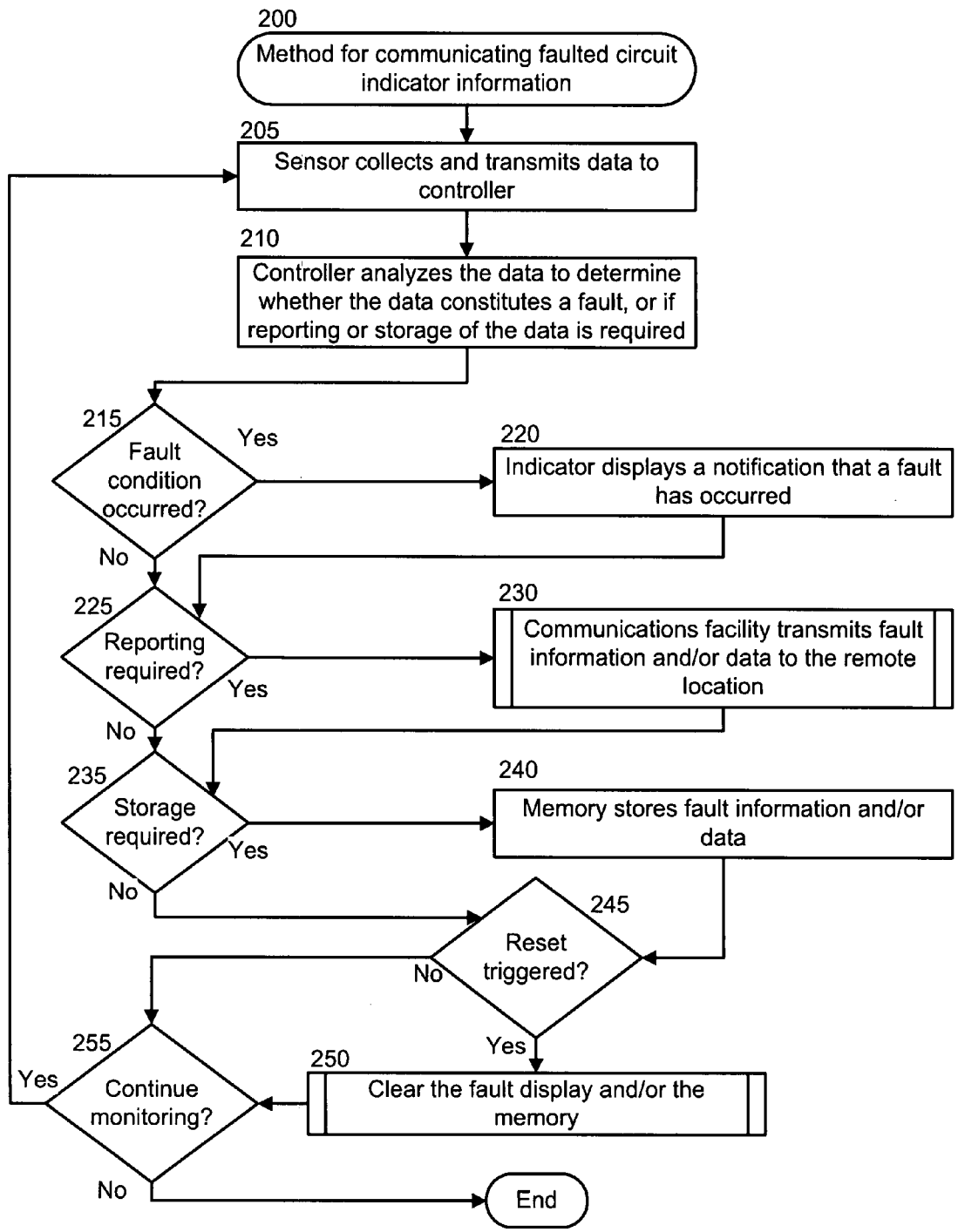
FIG. 2 is a flow chart illustrating a method for communicating faulted circuit indicator information using the FCI of FIG. 1 according to an exemplary embodiment of the invention.

FIG. 2 is a flow chart illustrating a method 200 for communicating faulted circuit indicator information using the FCI system 100 of FIG. 1 according to an exemplary embodiment of the invention. The method 200 will be described with reference to FIGS. 1 and 2.

In step 205, the sensor 102 collects data from the transmission line 116, the FCI system 100, or its surroundings. In step 210, the controller 104 analyzes the collected data to determine whether the collected data constitutes a fault, whether the data should be reported, and/or whether the data should be stored in memory 108.

In step 215, the controller 104 determines whether a fault condition has occurred based on the analysis conducted in step 210. If the controller 104 determines in step 215 that a fault condition has occurred, then the method 200 branches to step 220. In step 220, the controller 104 communicates the presence of the fault condition to the indicator 106, which displays an indication that a fault has occurred. The method 200 then proceeds to step 225.

Referring back to step 215, if the controller 104 determines that a fault condition did not occur, then the method 200 branches directly to step 225.

In step 225, the controller 104 determines whether the collected data and/or the fault condition is such that reporting is required. In an exemplary embodiment, the controller 104 can be programmed to make this determination based on the data itself, or based on other factors, such as the passage of a set period of time, or a direct demand from the utility company. If reporting is required, then the method 200 branches to step 230, wherein the controller 104 communicates the sensor data and/or the fault information, together with a communication instruction, to the communications facility 110, which transmits the collected data and/or the fault information to the remote location 114. Step 230 will be described in further detail hereinafter with reference to FIG. 3. The method 200 then proceeds to step 235.

Referring back to step 225, if the controller 104 determines that data should not be reported, the method 200 branches directly to step 235.

In step 235, the controller 104 determines whether the collected data and/or fault information should be stored in the memory 108. The determination can be made based on the controller's programming, as described above with respect to FIG. 1. If yes, then the method 200 branches to step 240, wherein the controller 104 stores the collected data and/or fault information in the memory 108. The method 200 then proceeds to step 245.

Referring back to step 235, if the controller 104 determines that storage is not required, then the method 200 branches directly to step 245.

In step 245, the controller 104 determines whether a reset has been triggered. If a reset has been triggered, the method 200 branches to step 250, wherein the controller 104 can clear the fault indication, the memory 108, or both. The reset procedure of step 250 is discussed in further detail hereinafter with reference to FIG. 4.

The method 200 then proceeds to step 255. Referring back to step 234, if the controller 104 determines that a resent has not been triggered, then the method 200 branches directly to step 255.

In step 255, the controller 200 determines whether to continue monitoring the transmission line 16. If yes, then the method 200 branches back to step 205. If not, then the method 200 ends.

Figure 3:
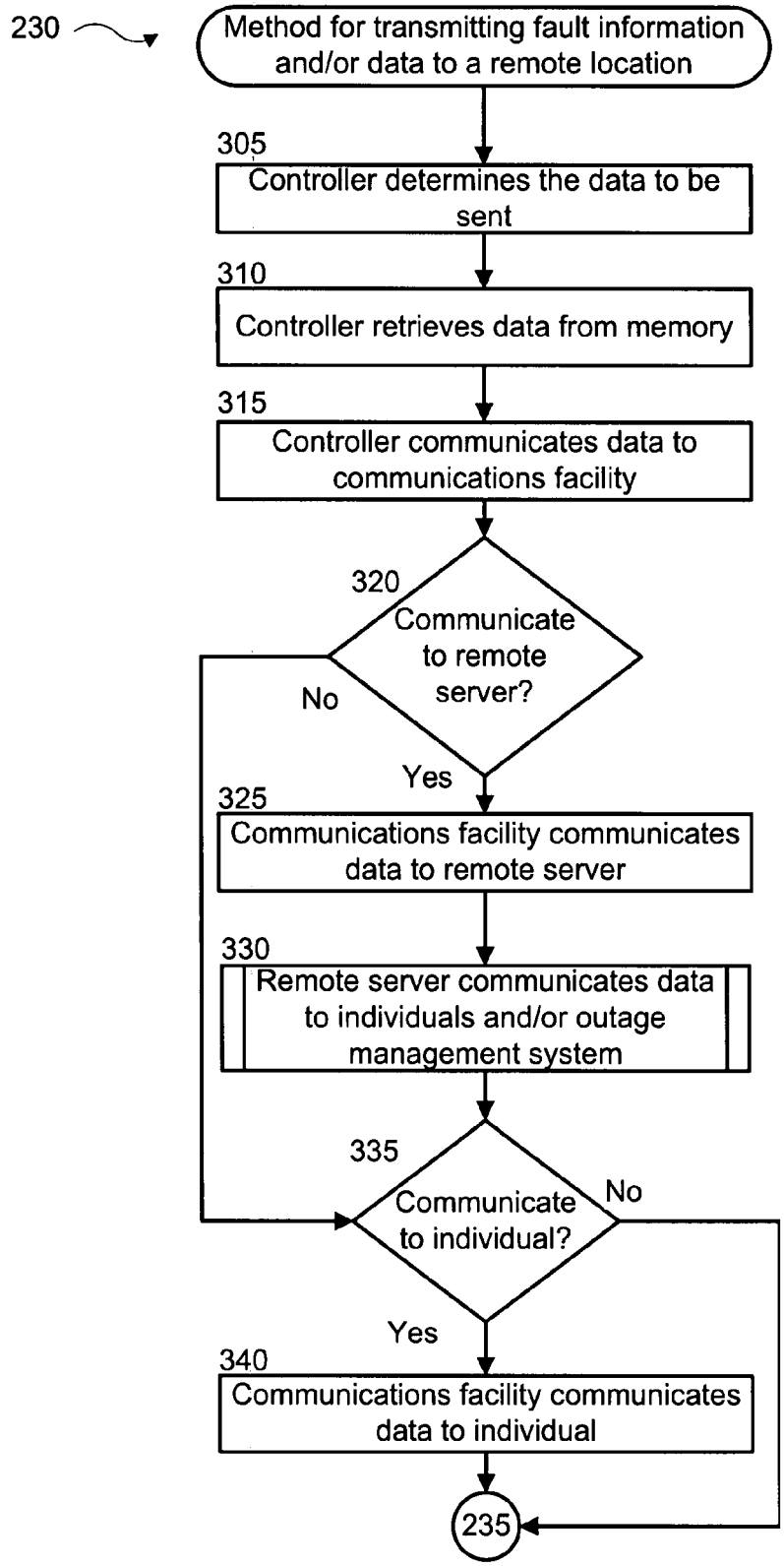
FIG. 3 is flow chart illustrating a method for transmitting fault information and/or data to a remote location according to an exemplary embodiment of the invention.

FIG. 3 is a flow chart illustrating a method 230 for transmitting fault information and/or data to the remote location 114 according to an exemplary embodiment of the invention, as referenced in step 230 of FIG. 2. The exemplary method 230 will be described with reference to FIGS. 1 and 3.

In step 305, the controller 104 determines, based on its programming, the data to be transmitted. This data can include information relating to a fault, if a fault event triggered the transmission. The data also can relate to measurements of the sensor 102, or other information relating to the FCI system 100, such as its global coordinates.

In step 310, if any of the data to be transmitted resides in the memory 108, the controller 104 retrieves that data. In step 315, the controller 104 transmits the data to the communications facility 110.

In step 320, the controller 104 determines, based on its programming, whether the data should be transmitted to a remote server or other similar system. If the controller 104 determines that data should not be transmitted to a remote server, the method 230 branches to step 330. If, however, the controller 104 determines in step 320 that data should be transmitted to a remote server, then the method 230 branches to step 325, wherein the communications facility 110 transmits the data to a remote server. In an exemplary embodiment, the data transmission is performed with cellular communications, although in other embodiments, the transmission may be by any of the wireless or wired transmission protocols described above with respect to FIG. 1. The method 230 then proceeds to step 330.

In step 330, the remote server communicates data to individuals or a utility company's outage management service to allow the individual or utility company to respond to the data. The communicating feature of step 330 is discussed in further detail hereinafter with respect to FIG. 5. The method 230 then proceeds to step 335.

In step 335, the controller 104 determines, based on its programming, whether the data should be transmitted to an individual, such as a line technician. If the controller 104 determines that data should not be transmitted to an individual or individual(s), then the method returns to step 240 of FIG. 3. If, however, the controller 104 determines that the data should be transmitted to an individual, then the method 230 branches to step 340, wherein the communications facility 110 uses a cellular protocol to transmit the data to an individual or individual(s). For example, the communications facility 110 could place a telephone call to the individual or individual(s). However, in an exemplary embodiment, the communications facility 110 can send a text message or electronic mail message directly to a cellular enabled device or device(s), such as a telephone or a personal digital assistant. The method 230 then proceeds to step 240 of FIG. 2.

Figure 4:
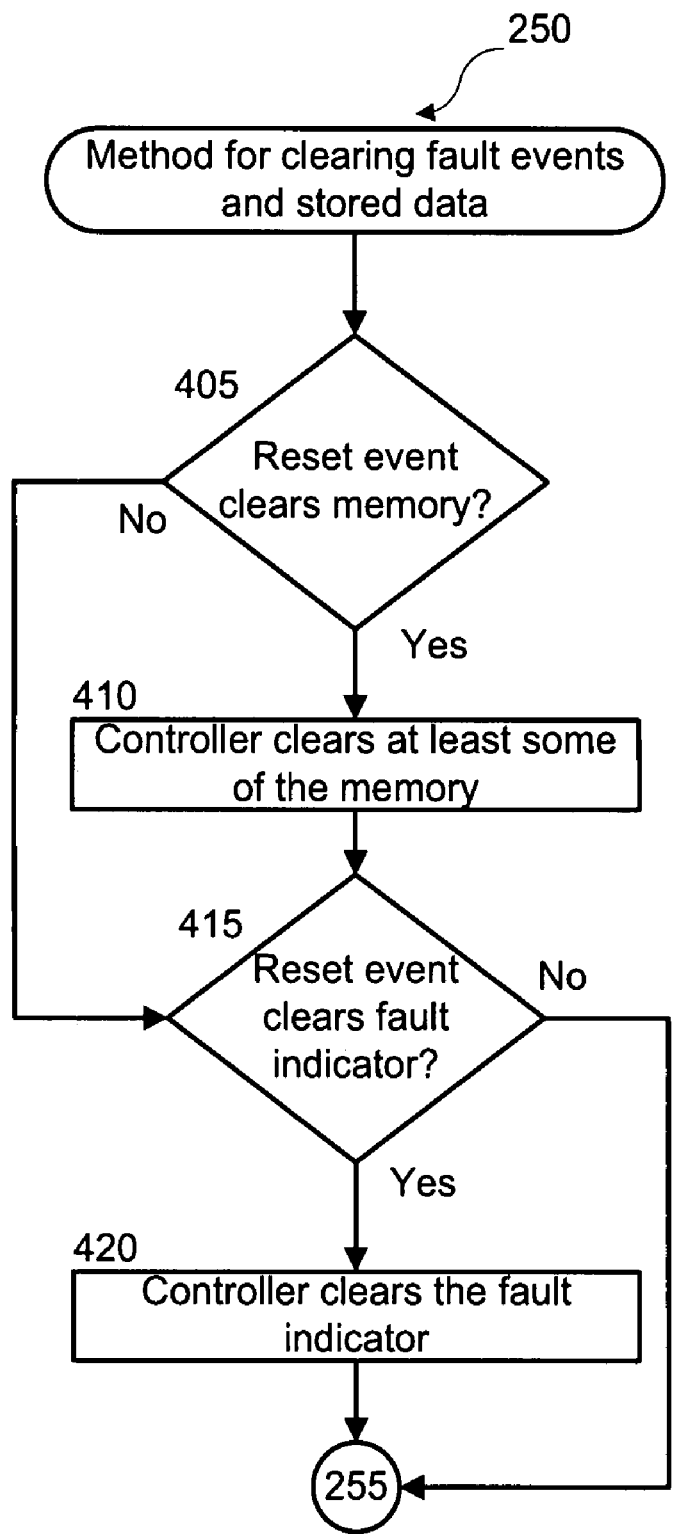
FIG. 4 is a flow chart illustrating a method for clearing fault events and line state history according to an exemplary embodiment of the invention.

FIG. 4 is a flow chart illustrating a method 250 for clearing fault events and line state history according to an exemplary embodiment of the invention, as referenced in step 250 of FIG. 2. The method 250 will be described with reference to FIGS. 1 and 4.

In step 405, the controller 104 determines, based on its programming, whether a reset signal instructs clearing the memory 108. As described above, a variety of events can trigger a reset, and a utility company can desire to have some events reset at least a portion of the memory 108, while others reset only the fault indication. If the controller 104 determines that the received reset signal does not instruct resetting the memory 108, then the method 250 proceeds to step 415.

If, however, the controller 104 determines that the received reset signal does instruct resetting the memory 108, then the method 250 branches to step 410, wherein the controller 104 clears at least a portion of the data from the memory 108, based on the instructions in the reset signal. The method 250 then proceeds to step 415.

In step 415, the controller 104 determines whether the reset signal instructs clearing the fault indicator 106. If the controller 104 determines that the received reset signal does not instruct resetting the fault indicator 106, then the method 250 branches to step 255 of FIG. 2.

If, however, the controller 104 determines that the received reset signal instructs resetting the fault indicator 106, the method 250 branches to step 420, wherein the controller 104 clears any indication that a fault has occurred from the fault indicator 106. After clearing the fault indication, the method 250 proceeds to step 255 of FIG. 2.

Figure 5:
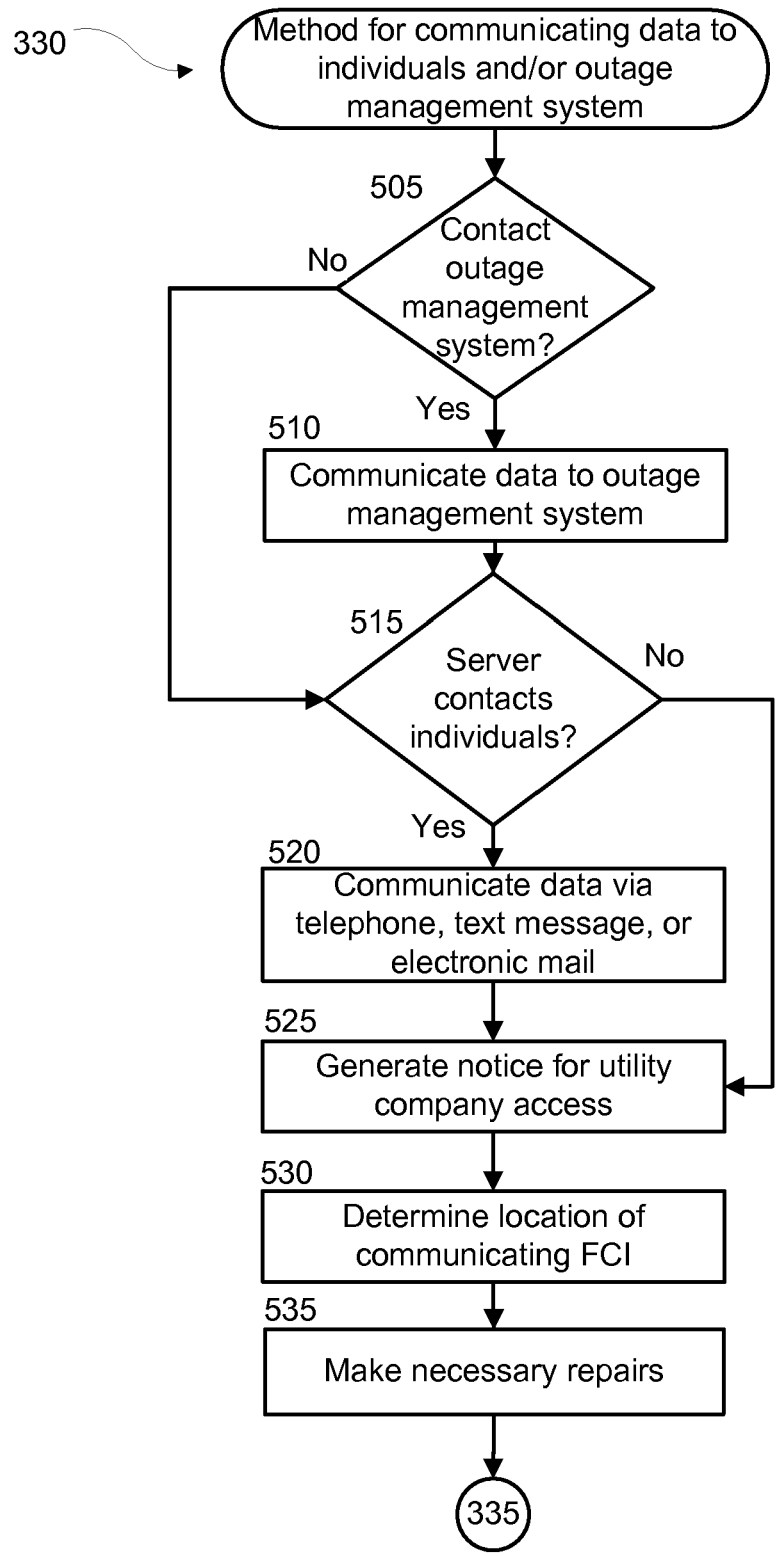
FIG. 5 is a flow chart illustrating a method for communicating data to individuals and/or an outage management system according to an exemplary embodiment of the invention.

FIG. 5 is a flow chart illustrating a method 330 for communicating data to individuals and/or an outage management system according to an exemplary embodiment of the invention. FIG. 5 presumes that a fault or other information of interest has been detected and has been transmitted to a central server. The method 500 will be described with reference to FIGS. 1 and 5.

In step 505 it is determined whether the server can contact the utility company's outage management system (OMS). If the server can contact the outage management system, the method 500 proceeds to step 510, wherein the server transmits the data to the OMS. The OMS can then display the data to operators on the utility company's existing systems. If the server cannot contact the utility company's OMS, the method 500 branches to step 515. The remote server also has capability to store all incoming information for historical purposes. This data historian can be used to analyze and improve the utility system performance.

In step 515, it is determined whether the server can contact individuals directly. If the server cannot contact individuals directly, the method 500 proceeds to step 520, wherein the server transmits the data to an individual via telephone call, text message, electronic mail message, or other similar form of communication. If, in step 515, it is determined that the server should not contact individuals, the method 500 branches to step 525.

In step 525, the server can generate an alternative presentation of the transmitted data for the utility company. In an exemplary embodiment, the server generates a web page or other content that is suitable for internet transmission that the utility company can visit through a standard internet browser or other network communications mechanism. The web page will present the data transmitted by the FCI system 100 in a graphical or textual form. This method also allows for the information to be presented via telephone calls, text messages, electronic mail, and other similar forms of communication. Once the alternative presentation is generated, the method 500 proceeds to step 530.

In step 530, the location of the transmitting FCI system 100 is determined. In an exemplary embodiment, this information is determined from the data itself, which preferably contains geographic coordinates for the FCI system 100 or the address where the FCI system 100 is installed. Alternatively, the location of the FCI system 100 can be determined by resolving a unique identifier for the FCI system 100 that is transmitted with the data using a table or other database that includes associations between FCI system 100 unique identifiers and locations. After determining the location of the transmitting FCI system 100, the method 500 proceeds to step 535, wherein a line technician makes any necessary repairs.

Based on the foregoing, it can be seen that the invention provides a faulted circuit indicator apparatus having a communications facility that is capable of transmitting data to a remote location. The invention also provides a method for communicating faulted circuit indicator information, as well as a method for using a communicating faulted circuit indicator. The invention is not limited to faulted circuit indicators, but may also be used to detect and report conditions on a variety of other apparatuses, such as transformers, low power conductors, capacitor banks, or other components of an electrical distribution system. Many other modifications, features, and embodiments of the invention will become evident to those of ordinary skill in the art. It should be appreciated, therefore, that many aspects of the invention were described above by way of example only and are not intended as required or essential elements of the invention unless explicitly stated otherwise. Accordingly, it should be understood that the foregoing relates only to certain embodiments of the invention and that numerous changes can be made therein without departing from the spirit and scope of the invention as defined by the following claims. It should also be understood that the invention is not restricted to the illustrated embodiments and that various modifications can be made within the scope of the following claims.

What is claimed is:

1. A faulted circuit indicator, comprising:
   a sensor configured to collect data relating to at least one state of an electrical conductor;
   a controller logically coupled to the sensor and configured to receive the data collected by the sensor and to determine, based on the data, whether to communicate the collected data to a location remote from the faulted circuit indicator; and
   a communications facility within the faulted circuit indicator, logically coupled to the controller, and configured to communicate the data to the remote location in response to the controller's determination to communicate the data to the remote location by way of cellular communications;
   wherein the communications facility comprises a second communications device for communicating with at least one additional faulted circuit indicator;
   wherein the faulted circuit indicator receives information regarding the at least one additional faulted circuit indicator via the second communications device; and
   wherein the communications facility communicates the information regarding the at least one additional faulted circuit indicator to the remote location via at least one of a cellular communications device, radio frequency communications device, and a wired communications device.

2. The faulted circuit indicator of claim 1, wherein the controller determines that the data should be communicated to the remote location if the data indicates that a fault has occurred on the electrical conductor.

3. The faulted circuit indicator of claim 2, further comprising an indicator that displays an indication of the fault.

4. The faulted circuit indicator of claim 1, wherein the controller determines that the data should be communicated to the remote location if the data indicates that a reportable condition exists on the electrical conductor.

5. The faulted circuit indicator of claim 1, further comprising a memory for storing at least one of the data relating to the state of the conductor and data relating to the faulted circuit indicator.

6. The faulted circuit indicator of claim 1, wherein the data collected by the sensor comprises at least one of a current, a voltage, a temperature, zero crossings, pressure, tilt, a vibration, dissolved gas content, a battery status, a frequency, a liquid level, and a power factor.

7. The faulted circuit indicator of claim 1, wherein the location remote from the faulted circuit indicator comprises a computing device configured to receive communications from the faulted circuit indicator.

8. The faulted circuit indicator of claim 1, wherein the location remote from the faulted circuit indicator comprises a cellular communications device.

9. A system for collecting data relating to at least one state of a plurality of electrical conductors, comprising:
   at least one first faulted circuit indicator and a second faulted circuit indicator,
   wherein each of the at least one first faulted circuit indicator comprises:
      a first sensor configured to collect first data relating to at least one state of a respective first electrical conductor;
      a first controller logically coupled to the first sensor and configured to receive the first data collected by the first sensor and to determine whether to communicate the first data to a location remote to the first faulted circuit indicator; and
      a first communications facility logically coupled to the controller and configured to communicate the first data to the second faulted circuit indicator in response to the first controller's determination to communicate the first data to the remote location,
   wherein the second faulted circuit indicator comprises:
      a second sensor configured to collect second data relating to at least one state of a second electrical conductor;
      a second controller logically coupled to the second sensor and configured to receive the second data collected by the second sensor and to determine whether to communicate the second collected data to a location remote to the second faulted circuit indicator; and
      a second communications facility logically coupled to the second controller and configured to receive the first data from the at least one first faulted circuit indicator and to communicate at least one of the first data and the second data to the remote location.

10. The system of claim 9, wherein the first communications facility comprises a first wireless communications device for communicating with the second communications facility.

11. The system of claim 10, wherein the second communications facility comprises at least one of a cellular communications device, a radio frequency communications device, and a wired communications device.

12. The system of claim 9, wherein the location remote from the faulted circuit indicator comprises a server configured to communicate at least one of the first data and the second data to at least one of a utility company computer or a personal digital assistant.

13. The system of claim 9, wherein the location remote from the faulted circuit indicator comprises a server configured to translate at least one of the first data and the second data to at least one of the following protocols: ICCP, DNP, Multispeak.

14. A faulted circuit indicator, comprising:
   a sensor configured to collect sensor data relating to an electrical conductor;

a controller logically coupled to the sensor and configured to receive the sensor data, the controller further configured to determine whether the sensor data is indicative of a fault on the electrical conductor; and a communications facility within the faulted circuit indicator, logically coupled to the controller, and configured to transmit the sensor data to a remote location;

wherein the communications facility is further configured to communicate with a second faulted circuit indicator;

wherein the faulted circuit indicator receives information regarding the second faulted circuit indicator via the communications facility; and wherein the communications facility further transmits the information regarding the second faulted circuit indicator to the remote location.

15. The faulted circuit indicator of claim 14, wherein the communications facility is further configured to transmit an indication of a fault to the remote location.

16. The faulted circuit indicator of claim 14, wherein the communications facility transmits the sensor data using cellular communications.

17. The faulted circuit indicator of claim 14, wherein the communications facility transmits the sensor data to the remote location if the sensor data is indicative of a fault.

18. The faulted circuit indicator of claim 14, wherein the communications facility transmits the sensor data to the remote location if the sensor data indicates that a reportable condition exists on the electrical conductor.

19. The faulted circuit indicator of claim 14, wherein the communications facility transmits the sensor data to the remote location after a predetermined period has elapsed.

20. The faulted circuit indicator of claim 14, wherein the sensor data comprises the amount of current flowing through the electrical conductor.

21. The faulted circuit indicator of claim 14, wherein the sensor data comprises the voltage on the electrical conductor.

22. The faulted circuit indicator of claim 14, wherein the sensor data comprises a temperature associated with the faulted circuit indicator.

23. The faulted circuit indicator of claim 14, wherein the sensor data comprises the power factor associated with the electrical conductor.

24. The faulted circuit indicator of claim 14, wherein the sensor data comprises the frequency of at least one of the voltage and the current on the electrical conductor.

25. The faulted circuit indicator of claim 14, wherein the sensor data comprises the harmonic content on the electrical conductor.

26. The faulted circuit indicator of claim 14, wherein the sensor data comprises a pressure associated with the faulted circuit indicator.

27. The faulted circuit indicator of claim 14, wherein the sensor data comprises the tilt of the faulted circuit indicator.

28. The faulted circuit indicator of claim 14, wherein the sensor data comprises the amount of vibration experienced by the faulted circuit indicator.

29. The faulted circuit indicator of claim 14, further comprising a memory for storing the sensor data.

30. The faulted circuit indicator of claim 14, wherein the remote location comprises a computing device configured to receive communications from the faulted circuit indicator.

31. The faulted circuit indicator of claim 14, wherein the remote location comprises a cellular communications device.

32. The faulted circuit indicator of claim 14, further comprising an indicator that displays an indication of the fault.

33. A faulted circuit indicator, comprising:
a sensor configured to collect sensor data relating to an electrical conductor;
a controller logically coupled to the sensor and configured to receive the sensor data, the controller further configured to determine whether the sensor data is indicative of a fault on the electrical conductor; and
a communications facility within the faulted circuit indicator, logically coupled to the controller, and configured to transmit the sensor data to a remote location in response to a request to transmit the sensor data;
wherein the communications facility is further configured to communicate with a second faulted circuit indicator;
wherein the faulted circuit indicator receives sensor data regarding the second faulted circuit indicator via the communications facility; and
wherein the communications facility further transmits the sensor data regarding the second faulted circuit indicator to the remote location.

34. The faulted circuit indicator of claim 33, wherein the communications facility is further configured to transmit an indication of a fault to the remote location.

35. The faulted circuit indicator of claim 33, wherein the collected data comprises at least one of current, a voltage, a temperature, zero crossings, pressure, tilt, a vibration, dissolved gas content, a battery status, a frequency, a harmonic level, a liquid level, and a power factor.

36. The faulted circuit indicator of claim 33, wherein the communications facility transmits the sensor data using cellular communications.

37. The faulted circuit indicator of claim 33, wherein the communications facility transmits the sensor data to the remote location if the sensor data is indicative of a fault.

38. The faulted circuit indicator of claim 33, wherein the request to transmit the sensor data originates from the remote location.

39. The faulted circuit indicator of claim 33, wherein the communications facility transmits the sensor data to the remote location after a predetermined period has elapsed.

40. The faulted circuit indicator of claim 33, further comprising a memory for storing the sensor data.

41. The faulted circuit indicator of claim 33, wherein the remote location comprises a computing device configured to receive communications from the faulted circuit indicator.

42. The faulted circuit indicator of claim 33, wherein the remote location comprises a cellular communications device.

43. The faulted circuit indicator of claim 33, further comprising an indicator that displays an indication of the fault.

* * * * *